United States Patent [19]
Weber et al.

[11] Patent Number: 5,541,558
[45] Date of Patent: Jul. 30, 1996

[54] CAPACITIVELY-TAPPED, VARIABLE, WIDEBAND BANDPASS FILTER

[75] Inventors: Leonard Weber, Windsor; Bruce A. Erickson; Edward M. Barich, both of Santa Rosa, all of Calif.

[73] Assignee: Hewlett-Packard Company, Palo Alto, Calif.

[21] Appl. No.: 333,013

[22] Filed: Nov. 1, 1994

[51] Int. Cl.⁶ .................................................... H03H 7/00
[52] U.S. Cl. .......................................... 333/174; 333/175
[58] Field of Search ................................... 333/174, 175, 333/167

[56] References Cited

U.S. PATENT DOCUMENTS 3,728,476   4/1973   Bates et al. ................................ 333/174

FOREIGN PATENT DOCUMENTS 125849   3/1959   U.S.S.R. .

*Primary Examiner*—Benny Lee
*Assistant Examiner*—David H. Vu
*Attorney, Agent, or Firm*—Pamela Lau Kee

[57] ABSTRACT

A wideband bandpass filter has a tank circuit connected between an input and output tapping circuit. The tank circuit contains a variable capacitor and an inductor in parallel. The tank circuit determines a center frequency for the bandpass filter. The input tapping circuit has an input variable impedance, and the output tapping circuit has an output variable impedance. The input and output variable impedances determine the continuously variable bandwidth of the filter.

8 Claims, 8 Drawing Sheets

CAPACITIVELY-TAPPED, VARIABLE, WIDEBAND BANDPASS FILTER

FIELD OF THE INVENTION

The present invention relates to bandpass filters and, more specifically, to reducing distortion and noise figure for bandpass filters. One embodiment of the invention provides a capacitively-tapped, variable, wideband bandpass filter having improved distortion and noise figure characteristics while preferably also providing input and output impedance matching.

BACKGROUND OF THE INVENTION

The bandwidth of a filter can be described by its quality factor (Q) and its center frequency $\omega_0$. Q is a measure of the sharpness of the peak of the bandwidth response function. For a simple resonant circuit, such as an LC filter, Q can be interpreted as the ratio of $\omega_0$ to the full width of the peak between the upper and lower half power points (3 dB). Another measure of the filter performance is the noise figure, which is the signal to noise ratio of the applied input to the signal to noise ratio at the output. It is desirable that the noise figure be low to preserve dynamic range.

Generally, LC filters having inductors and capacitors are used where variable frequency selectivity is required. In conventional variable, wideband bandpass filters, the bandwidth of the filter can be altered as desired by adjusting a variable resistor. FIG. 1 illustrates a prior art simplified circuit topology, where the bandwidth of the filter is adjusted by varying the resistance. Such a filter is used, for example, in the Hewlett-Packard Company HP 8552B spectrum analyzer. The Q and $\omega_0$ of the circuit are $$Q = R\sqrt{\frac{C}{L}}$$

$$\omega_0 = \frac{1}{\sqrt{LC}}$$

If the JFET shown in FIG. 1 is assumed to have infinite input impedance then the bandwidth is limited in the widest mode by the 50 Ω input and in the narrowest mode by the maximum resistance of the variable resistor.

There are a few problems with this filter. In narrow bandwidths, the large resistance of R causes the noise figure to be degraded. Using an active device, such as a JFET, adds parasitic capacitance to the tank. Thirdly, the input impedance of the filter does not match the 50 Ω input.

Another simplified circuit topology of a prior art filter, used in the Hewlett-Packard Company HP 8566B spectrum analyzer, is illustrated in FIG. 2. This circuit has good input and output impedance matches but still has a poor noise figure. In addition, because the tank is connected to the collector of Q1, the filter has bad distortion due to the high RF voltage present on the tank.

Each of the aforementioned filters uses active devices to provide a variable bandwidth filter, which introduces distortion into the filter. Furthermore, the resulting circuits are DC power intensive, particularly with pin diodes or bipolar transistors as the active devices.

What is desirable is a variable bandwidth filter using passive elements which do not introduce distortion. It would also be beneficial if the filter was DC power efficient.

SUMMARY OF THE INVENTION

A wideband bandpass filter in accordance with one embodiment of the invention has variable capacitors to provide a continuously variable frequency response. A tank circuit is connected between an input and output tapping circuit. The tank circuit preferably contains a variable capacitor and an inductor in parallel. The variable capacitor in the tank circuit determines a center frequency for the bandpass filter. The input tapping circuit has an input variable impedance, and the output tapping circuit has an output variable impedance. The input and output variable impedances determine the continuously variable bandwidth of the filter.

DETAILED DESCRIPTION OF THE PREFERRED EMBODIMENTS

A wideband bandpass filter has a tank circuit that uses a capacitor to determine a center frequency. The tank circuit is connected between an input and output tapping circuit. The tank circuit preferably contains a variable capacitor and an inductor in parallel. The input tapping circuit has an input variable impedance, and the output tapping circuit has an output variable impedance. The input and output variable impedances determine a continuously variable bandwidth of the filter.

Figure 1:
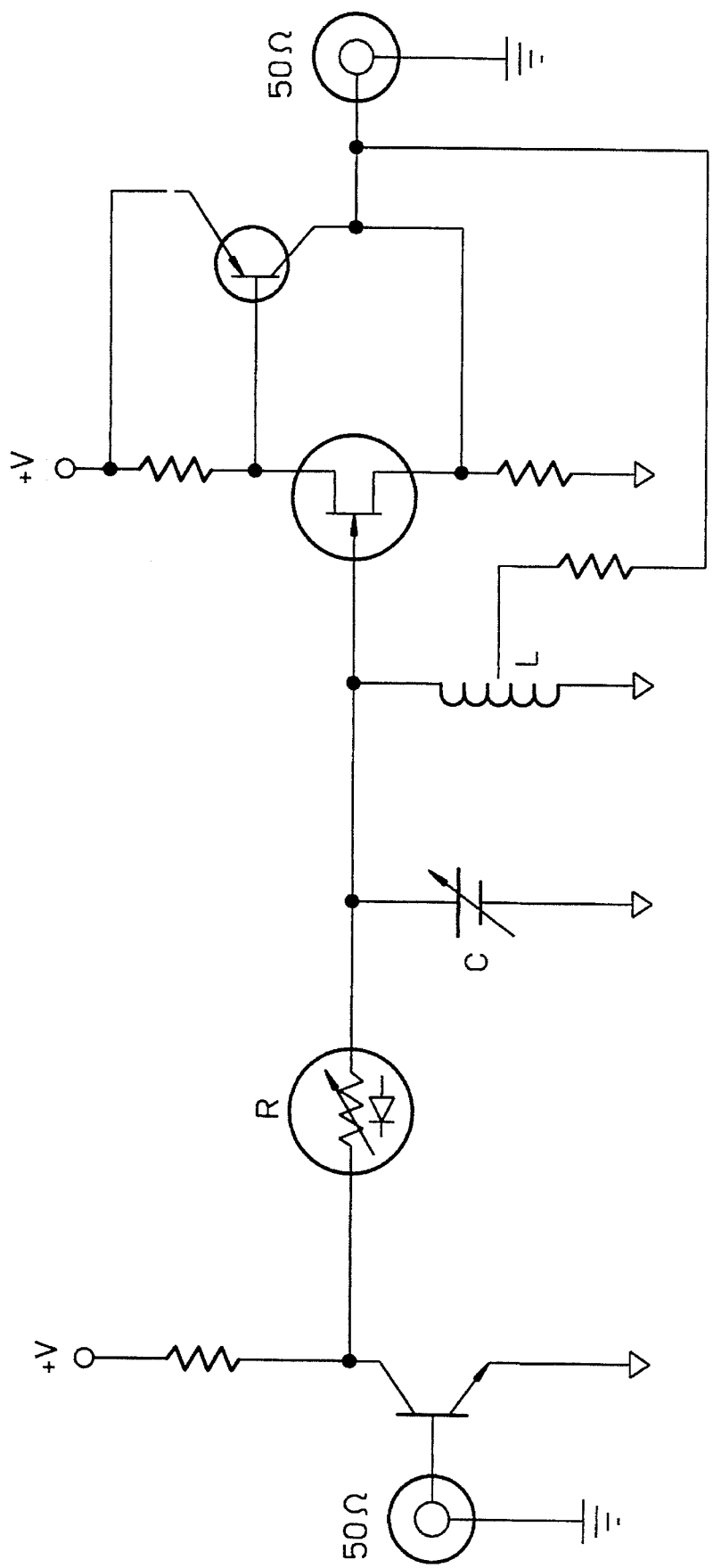
FIG. 1 illustrates a prior art filter where the bandwidth is adjusted by varying the resistance.
Figure 2:
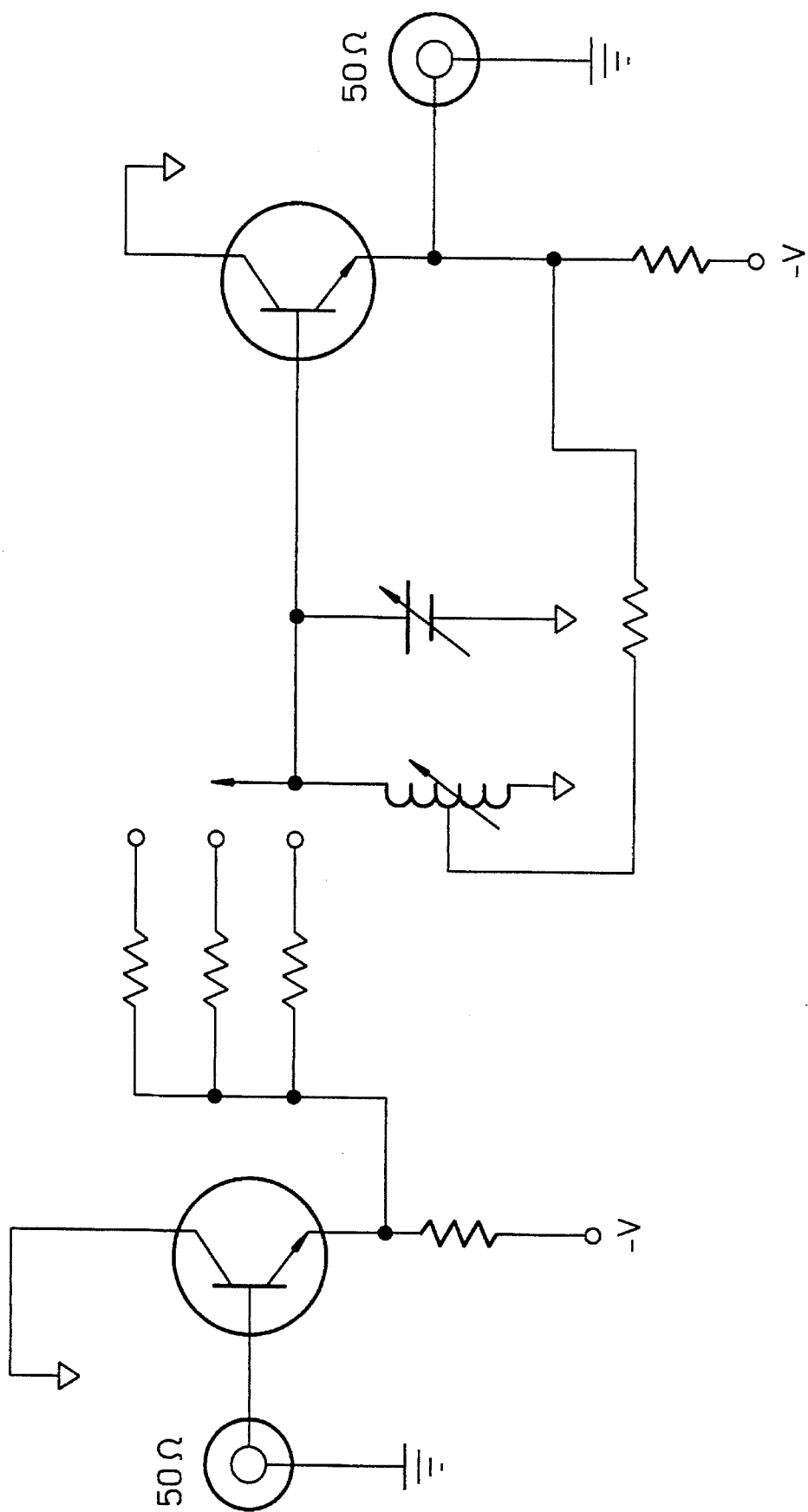
FIG. 2 illustrates another prior art filter.
Figure 3:
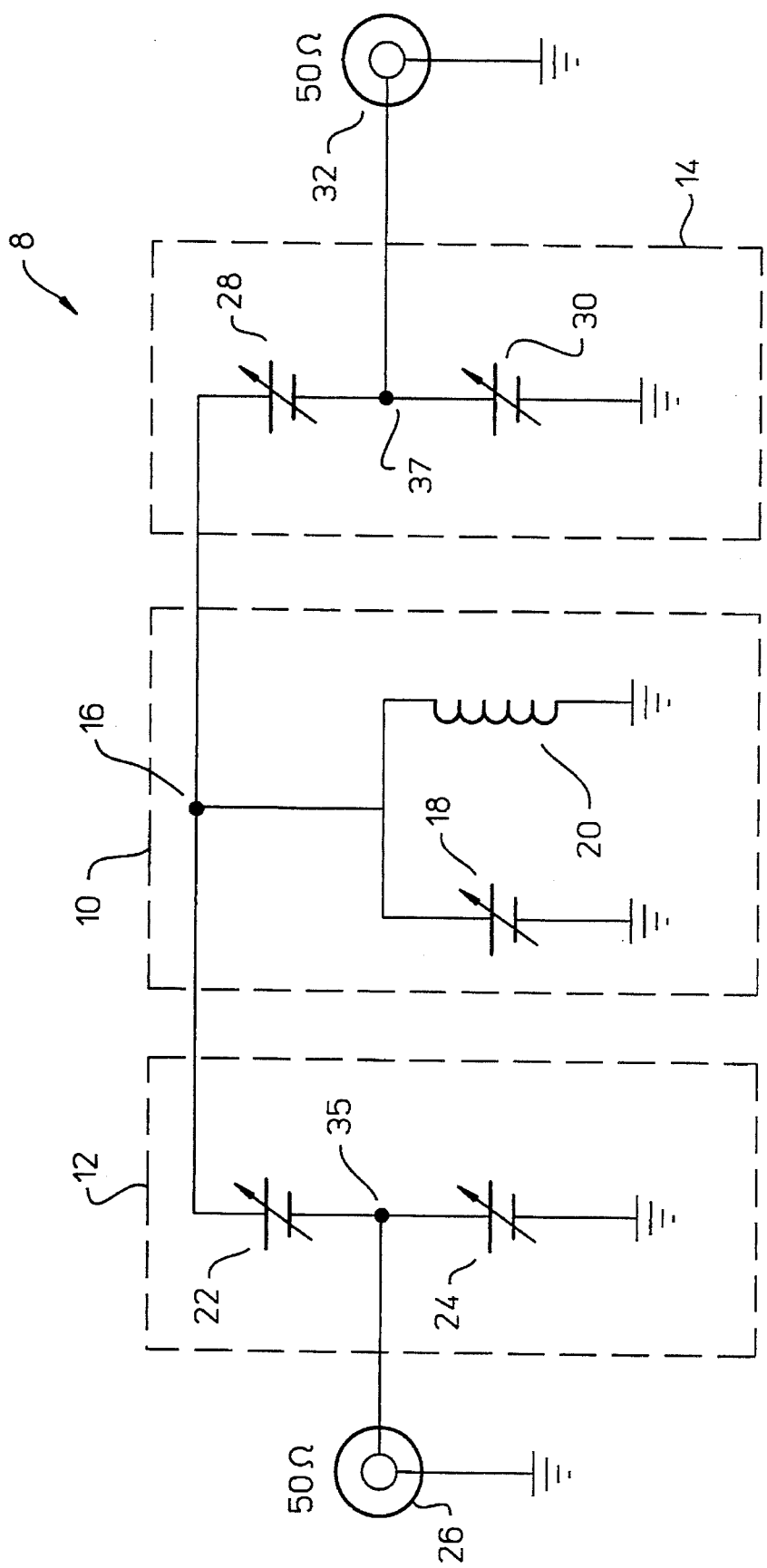
FIG. 3 illustrates a wideband bandpass filter in accordance with one embodiment of the invention using passive variable capacitance elements.

FIG. 3 illustrates a wideband bandpass filter 8 in accordance with one embodiment of the invention. A tank circuit 10 is connected between an input tapping circuit 12 and an output tapping circuit 14. The tank circuit 10 has a balancing node 16. A variable capacitor 18 is connected between the balancing node 16 and common (ground). An inductor 20 is connected between the balancing node 16 and ground. The input tapping circuit 12 has a first input variable impedance element 22 connected to the balancing node 16. A second input variable impedance element 24 is connected between the first input variable impedance element 22 and ground. An input port 26, for example, a 50 Ω port, is connected between the first and second input variable impedance elements 22, 24. The output tapping circuit 14 has a first output variable impedance element 28 connected to the balancing node 16. A second output variable impedance element 30 is connected between the first output variable impedance element 28 and ground. An output port 32, for example, a 50 Ω port, is connected between the first and second output variable impedance elements 28, 30.

The impedances of the input and output tapping circuits 12, 14 determine the continuously variable frequency response (bandwidth) of the bandpass filter 8 while the impedance of variable capacitor 18 determines a center frequency for the filter.

In this embodiment, the variable capacitor impedance elements were selected to be back-to-back varactors to minimize distortion. Other passive elements such as variable capacitive diodes could also be used. If a fixed center frequency wide bandwidth filter is desired, a fixed capacitor can be used in place of the variable capacitor 18.

Figure 4A:
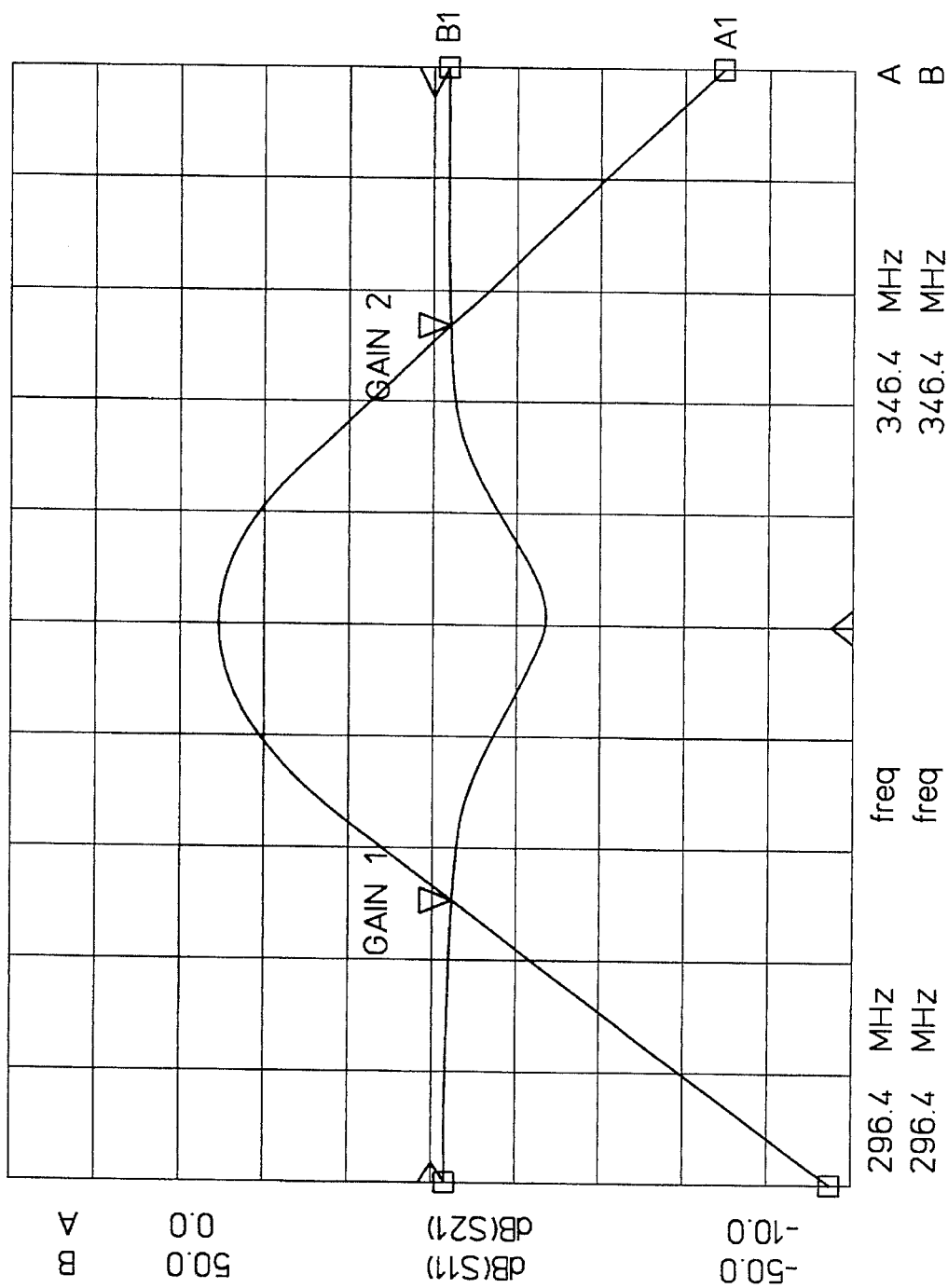
FIGS. 4A–B illustrate the response of the filter shown in FIG. 3.

In a first implementation of the filter 8 shown in FIG. 3, the first input impedance element 22 and the second output impedance element 28 are varactors, each having a value of 3.3 pF. The second input impedance element 24 and the second output impedance element 30 are varactors, each having a value of 9.2 pF. The variable capacitor 18 of the tank circuit 10 has a value of 8.1 pF while the inductor 20 has a value of 18 nH. FIG. 4A illustrates the response of the filter 8 when a narrow bandwidth setting, approximately 8% of full bandwidth, is selected.

Figure 4B:
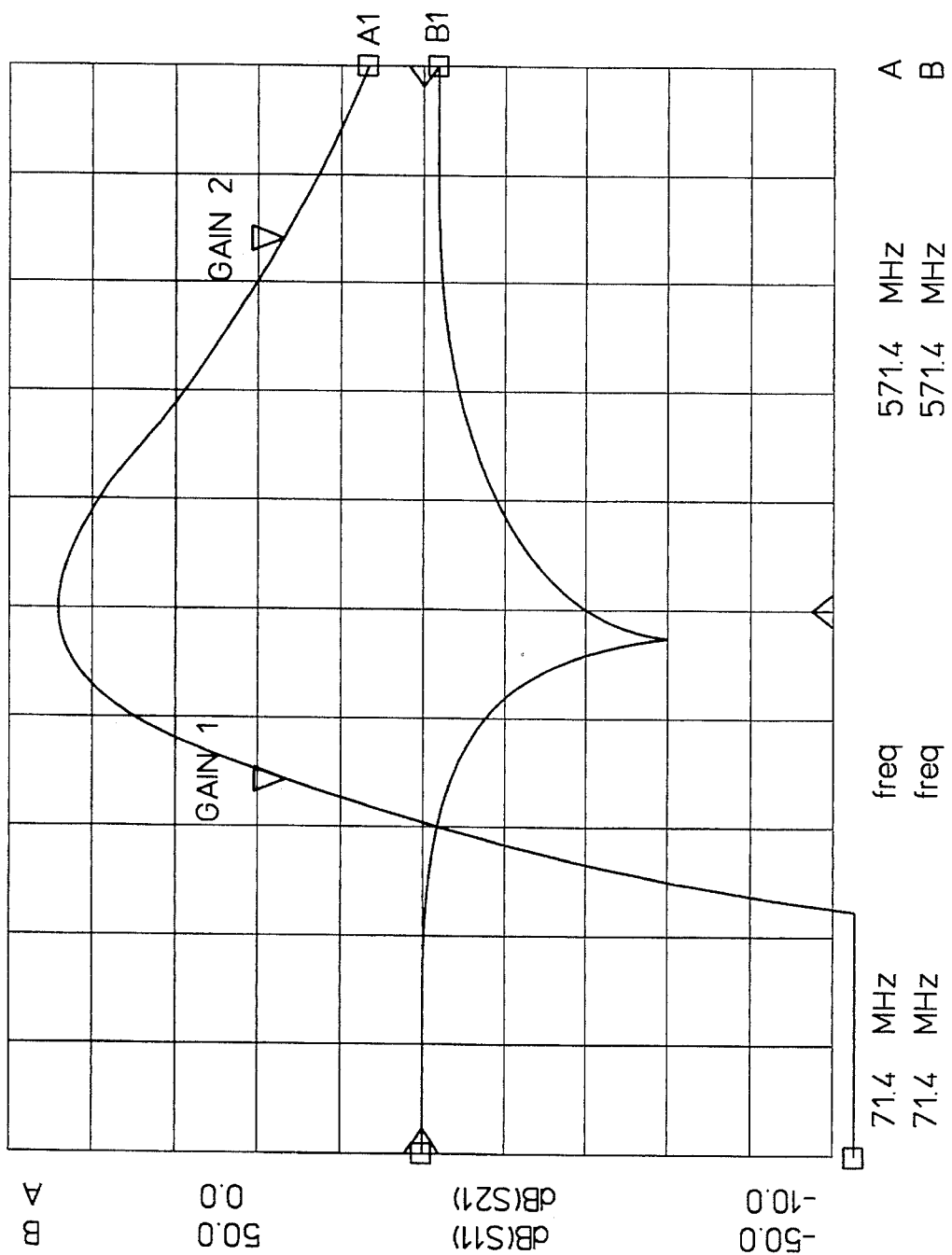

In a second implementation of the filter 8 shown in FIG. 3, the first input impedance element 22 and the second output impedance element 28 each have values of 10.3 pF. The second input impedance element 24 and the second output impedance element 30 each have values of 3.2 pF. The variable capacitor 18 now has a value of 4.1 pF while the inductor 20 has a value of 18 nH. FIG. 4B illustrates the response of the filter 8 when a wide bandwidth setting, approximately 80% of full bandwidth, is selected.

In operation, the filter topology illustrated in FIG. 3 has high pass filter characteristics when the bandwidth is increased beyond 250 MHz. As the bandwidth increases the first input and output variable impedance elements 22, 28, 30 dominate the filter response. The resulting filter tends to attenuate the lower frequencies and pass the higher frequencies.

As shown in FIGS. 4A and 4B, the wideband filter 8, illustrated in FIG. 3, has a continuously variable bandwidth from 27 MHz to 270 MHz at a center frequency of 321.4 MHz, low insertion loss (1–5 dB), and a noise figure (2–6 dB), excellent distortion characteristics (+30 dBm third order intercept referred to the output), and extremely low power consumption (less than 100 microwatts). The settings of the varactors can be controlled by digital-to-analog converters so that no manual alignment is required.

Figure 5:
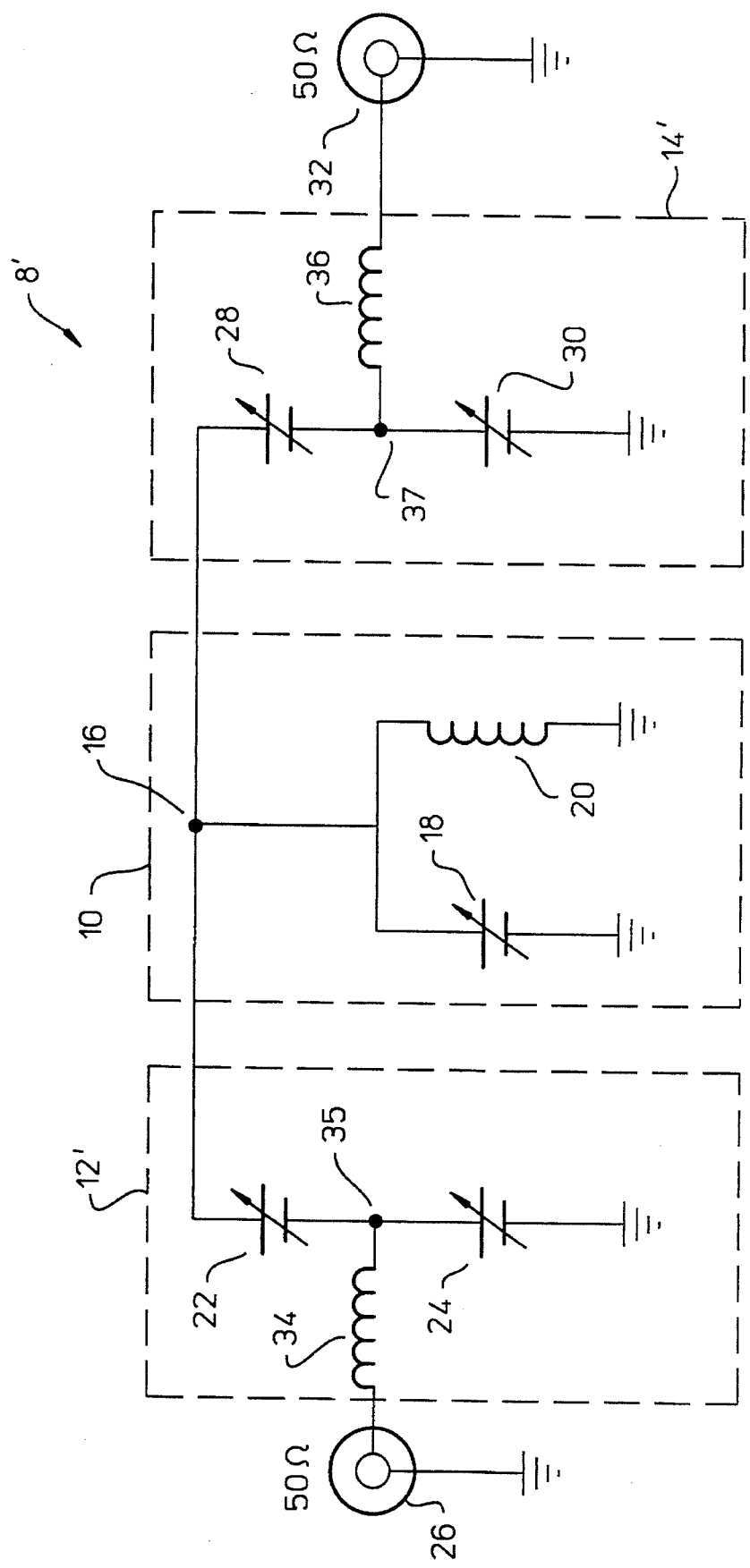
FIG. 5 illustrates another embodiment of a wideband bandpass filter in accordance with the invention using passive variable capacitance elements.

FIG. 5 illustrates another embodiment for a filter 8' in accordance with the invention. The input tapping circuit 12' further includes an input inductor 34 connected in series from a load node 35 between the first and second input variable impedance elements 22, 24 to the input port 26. The output tapping circuit 14' further includes an output inductor 36 connected in series from a load node 37 between the first and second output variable impedance elements 28, 30 to the output port 32.

In one implementation, the input and output inductors 34, 36 cancel the effect of the capacitors in the input and output tapping circuits 12', 14', respectively. The respective Q of the input and output tapping circuits 12', 14' is selected to be low enough not to limit the widest setting of the tank circuit 10. These Qs do not impact the tank circuit 10 in narrower settings because the input and output tapping circuits 12', 14' have much greater bandwidths than the tank circuit. Thus, the variable frequency response of the filter 8' is broad when the first input and output variable impedance elements 22, 28, 30 dominate the circuit. The variable frequency response of the filter 8' is narrow when the second input and output variable impedance elements 22, 28, 30 dominate the circuit.

Figure 6A:
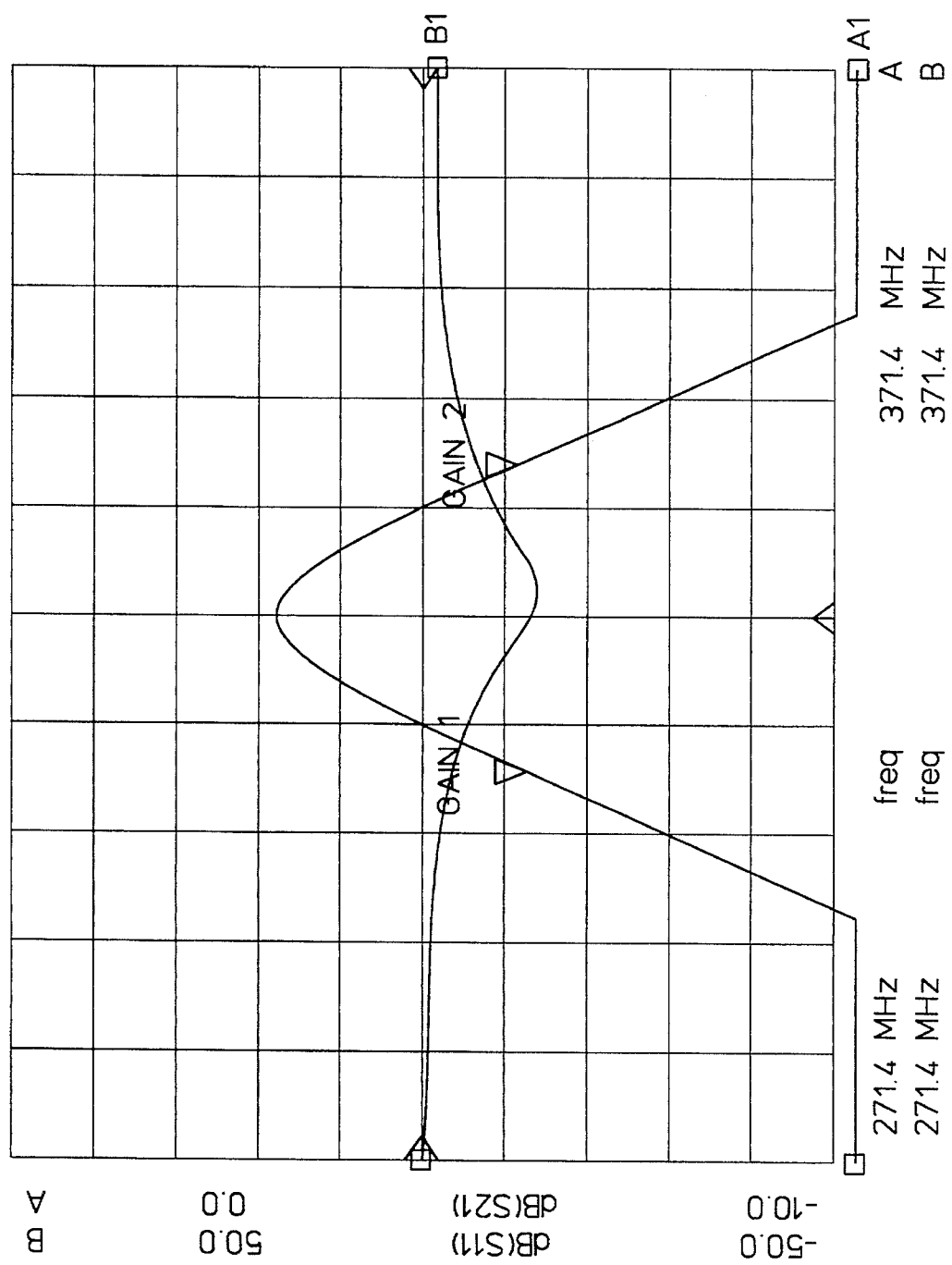
FIGS. 6A–B illustrate the response of the filter shown in FIG. 5.

In a first implementation of the filter 8' shown in FIG. 5, the first input impedance element 22 and the second output impedance element 28 are varactors, each having a value of 3.9 pF. The second input impedance element 24 and the second output impedance element 30 are varactors, each having a value of 14.7 pF. The variable capacitor 18 of the tank circuit 10 has a value of 7.5 pF while the inductor 20 has a value of 18 nH. The input and output inductors 34, 36 are each 18 nH. FIG. 6A illustrates the response of filter 8' when a narrow bandwidth setting, approximately 8% of full bandwidth, is selected.

Figure 6B:
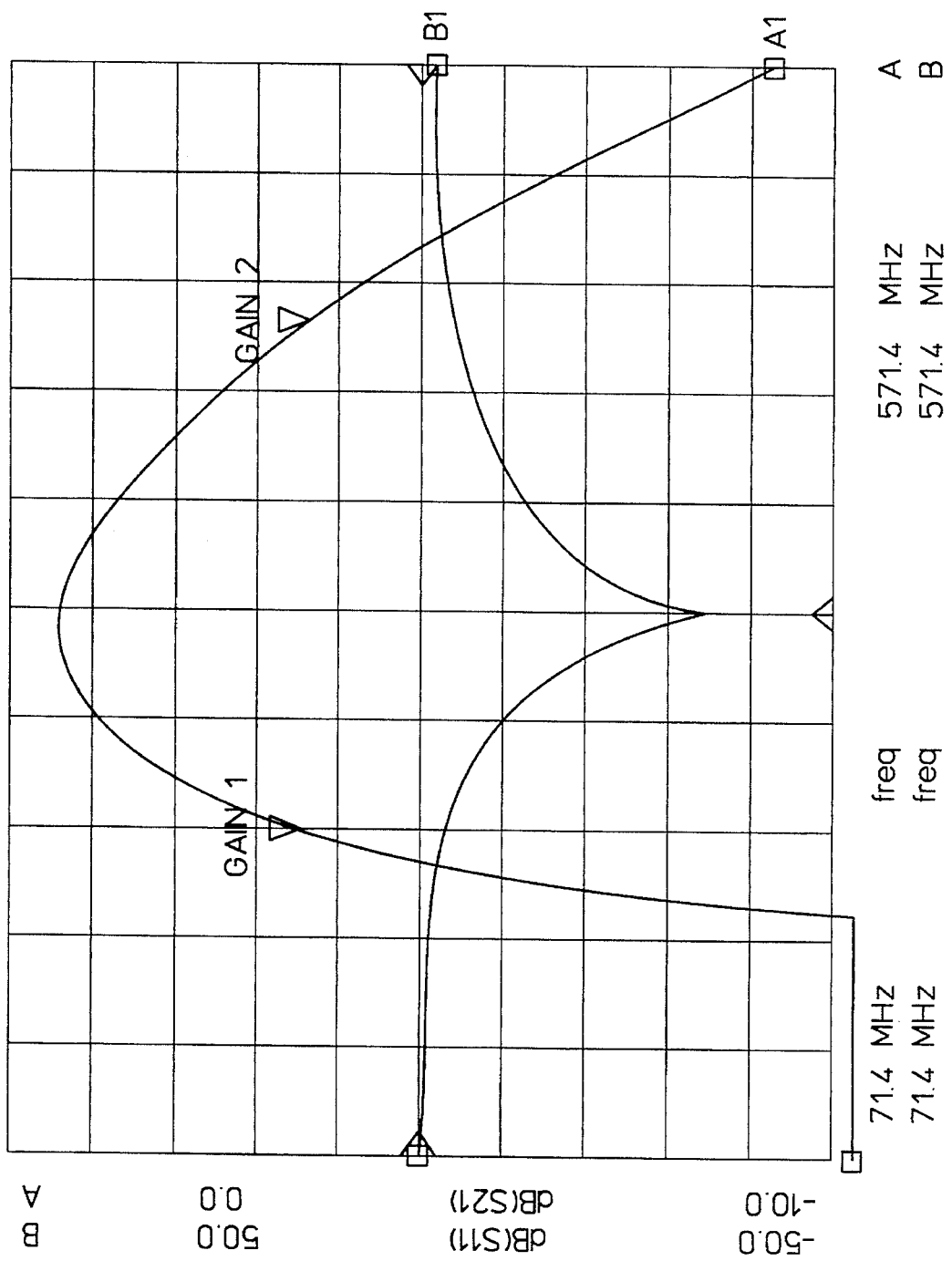

In another implementation of the filter 8' shown in FIG. 5, the first input impedance element 22 and the second output impedance element 28 are varactors, each having a value of 8.9 pF. The second input impedance element 24 and the second output impedance element 30 are varactors, each having values of 4.7 pF. The variable capacitor 18 of the tank circuit 10 has a value of 7.5 pF while the inductor 20 has a value of 18 nH. The input and output inductors 34, 36 are each 18 nH. FIG. 6B illustrates the response of the filter 8' when a wide bandwidth setting, approximately 80% of full bandwidth, is selected.

As shown in FIGS. 6A and 6B, although the wideband filter 8' has comparable operating parameters to the wideband filter 8 illustrated in FIG. 3, the input and output inductors 34, 36 tune out the effects of the input and output tapping circuits 12', 14' while retaining the desired bandpass filter characteristics.

We claim:

1. A wideband bandpass filter having a continuously variable frequency response comprising:
   a tank circuit having a balancing node, including:
      a capacitor connected between the balancing node and ground, and
      a first inductor connected between the balancing node and ground; and
   a first and a second passive circuit being operative to change the effective load on the tank circuit to vary the Q factor, each having a varying impedance, connecting between the balancing node and ground, the first passive circuit connecting to an input port, the second passive circuit connecting to an output port, one of the first and the second passive circuits further including:
      a storage device, connecting to the balancing node, having a connecting node, and
      a second storage device, connecting between the connecting node and ground,
   wherein the variable frequency response is broad when the second storage device has higher impedance than the first storage device and the variable frequency response is narrow when the first storage device has higher impedance than the second storage device.

2. A wideband bandpass filter, as defined in claim 1, wherein the second storage device is a variable capacitive diode.

3. A wideband bandpass filter, as defined in claim 1, wherein the first storage device is a variable capacitive diode.

4. A wideband bandpass filter, as defined in claim 1, wherein one of the first and second passive circuits further comprises a matching circuit that connects between the connecting node and the input port.

5. A wideband bandpass filter, as defined in claim 4, wherein the matching circuit comprises a second inductor connected between the connecting node and the input port.

6. A wideband bandpass filter, as defined in claim 1, wherein one of the two passive circuits is impedance matched at a corresponding port.

7. A wideband bandpass filter, as defined in claim 1, wherein the capacitor included in the tank is a variable capacitor and the capacitance of the variable capacitor is adjusted to set a center frequency for the filter.

8. A wideband bandpass filter, as defined in claim 7, wherein the input port is a 50 Ω port.

\* \* \* \* \*